United States Patent
Mottier

(10) Patent No.: US 7,692,465 B2
(45) Date of Patent: Apr. 6, 2010

(54) METHODS FOR GENERATING PWM-SIGNALS

(75) Inventor: Samuel Mottier, Lausanne (CH)

(73) Assignee: ETEL S.A., Motiers (CH)

( * ) Notice: Subject to any disclaimer, the term of this patent is extended or adjusted under 35 U.S.C. 154(b) by 0 days.

(21) Appl. No.: 12/246,201

(22) Filed: Oct. 6, 2008

(65) Prior Publication Data

US 2009/0091365 A1 Apr. 9, 2009

(30) Foreign Application Priority Data

Oct. 9, 2007 (DE) .................. 10 2007 048 439

(51) Int. Cl.
*H03K 3/017* (2006.01)

(52) U.S. Cl. ..................... 327/175; 327/172

(58) Field of Classification Search ............ None
See application file for complete search history.

(56) References Cited

U.S. PATENT DOCUMENTS 4,502,024 A * 2/1985 Nishikawa et al. .......... 332/109
6,351,162 B1 * 2/2002 Schwartz .................. 327/110
7,313,005 B2 * 12/2007 Azuma et al. .............. 363/41
7,453,250 B2 * 11/2008 Qiu et al. .................. 323/288
7,583,158 B2 * 9/2009 Makita et al. .............. 332/109
2007/0153890 A1 7/2007 Huber et al.

FOREIGN PATENT DOCUMENTS

DE 10 2005 061 388 6/2007

* cited by examiner

*Primary Examiner*—Cassandra Cox
(74) *Attorney, Agent, or Firm*—Kenyon & Kenyon LLP

(57) ABSTRACT

In a method for generating a PWM-signal to drive the power transistors of a half-bridge of a converter with the aid of a digital circuit, a digital reference value is compared to the counter content of a digital counting ramp, and a logic state of the PWM-signal is dependent upon whether the reference value is greater than the counter content of the counting ramp. In this context, at least two counters count counter contents of the counting ramp following one another in alternation, and the logic state of the PWM-signal is dependent upon whether the reference value is greater than the counter contents of counting ramps of each of the at least two counters.

6 Claims, 5 Drawing Sheets

METHODS FOR GENERATING PWM-SIGNALS

CROSS-REFERENCE TO RELATED APPLICATIONS

The present application claims priority to Application No. 10 2007 048 439.0, filed in the Federal Republic of Germany on Oct. 9, 2007, which is expressly incorporated herein in its entirety by reference thereto.

FIELD OF THE INVENTION

The present invention relates to a method for generating PWM (Pulse-Width Modulated) signals. Such PWM-signals are used for driving power transistors in a converter.

BACKGROUND INFORMATION

A converter is used, for example, to convert the direct voltage of an intermediate circuit into a three-phase alternating current for driving an electric motor having three motor phases.

FIG. 1 is a circuit diagram of a converter U as described, for example, in German Published Patent Application No. 10 2005 061 388. Each motor phase U, V, W of an electric motor M is connected either to the positive intermediate-circuit voltage $+U_z$ or to the negative intermediate-circuit voltage $-U_z$ by half-bridge circuits B, each having two power transistors T. To that end, a logic PWM-signal PWM is applied to each half-bridge B made up of two serially-connected power transistors T, in each case one power transistor being driven directly, the other via an inverter I. In this manner, each motor phase is either at $+U_z$ (logic 1) or at $-U_z$ (logic 0), depending on the logic level of the respective PWM-signal. It should be noted that, when switching between $+U_z$ and $-U_z$, a brief dead time must be observed during which both power transistors T of a half-bridge B are non-conductive, in order to avoid a short circuit of the intermediate-circuit voltage.

FIG. 2 shows one possibility for generating PWM-signals in simplified form. The PWM-signals are pulse-width modulated square-wave signals. For each motor phase U, V, W, a delta voltage Ud is compared to a control voltage Us, Vs, Ws. For example, if control voltage Vs is above delta voltage Ud, then PWM-signal PWM for motor phase V is logic 1, and motor phase V is connected to positive intermediate-circuit voltage $+U_z$. If the control voltage is below the delta voltage, then the associated PWM-signal is logic 0, and the associated motor phase is connected to negative intermediate-circuit voltage $-U_z$. Thus, the higher the control voltage, the longer the respective motor phase is connected to $+U_z$, and vice versa. The average voltage applied to the specific motor phase is thus adjusted via the pulse duty factor of the PWM-signal.

The higher the frequency of delta voltage Ud, also referred to as the PWM-frequency, the better the voltage in the motor phase, predefined by the control voltage, can be adjusted by pulse width modulation. Higher PWM-frequencies result in a more rapid attainment of the necessary motor currents as well as a decrease in current ripple and a decrease in eddy current losses associated with it.

In digitally controlled converters, the analog delta signal of FIG. 2 is replaced by a counting ramp. The control voltage is predefined as a variable digital reference value, the value range of the reference value, for reasons explained in greater detail below, corresponding approximately to the value range of the counting ramp, but being somewhat smaller.

If, on one hand, highly resolved values are desired for the reference value, and on the other hand, high PWM-frequencies, the necessary counting frequency may then become very high, because the counting frequency is proportional to the product of the required resolution of the reference value and the PWM-frequency. The clock-pulse rates of commonly-used and affordable digital circuits may not be adequate for this purpose.

SUMMARY

Therefore, example embodiments of the present invention provide a method for generating PWM-signals with which the highest possible PWM-frequencies, accompanied by high resolution of the reference values, are able to be realized using affordable digital circuits.

According to example embodiments of the present invention, a method is provided for generating a PWM-signal to drive the power transistors of a half-bridge of a converter with the aid of a digital circuit, according to which a digital reference value is compared to the counter content of a digital counting ramp, a logic state of the PWM-signal being dependent upon whether the reference value is greater than the counter content of the counting ramp. In this context, at least two counters count counter contents of the counting ramp following one another in alternation. The logic state of the PWM-signal depends upon whether the reference value is greater than the counter contents of counting ramps of each of the at least two counters.

For example, if a counting ramp having a counting frequency of 295 MHz is needed (details concerning this numerical example follow below), this limits the selection of available circuits such as FPGAs (Field Programmable Gate Arrays) considerably. However, if, as described, two counters are used which, with half speed, in each case count only even or uneven values of the counting ramp in alternation and therefore offset relative to one another, then a circuit allowing counting frequencies of approximately 150 MHz is sufficient. Such circuits are inexpensively available on the market.

If, in addition, a suitably selected reference value is used for each of the two counters, then the above-mentioned dead time when switching between the two transistors of a half-bridge circuit may be observed in an easy manner. Other measures for adhering to the dead time are therefore superfluous and it is possible to dispense with them.

According to example embodiments of the present invention, a method for generating a PWM-signal to drive power transistors of a half-bridge of a converter with the aid of a digital circuit includes: counting, by at least two counters, counter contents of a corresponding counting ramp following one another in alternation; comparing a digital reference value to the counter content of a digital counting ramp; and generating the PWM-signal, a logic state of the PWM-signal being dependent upon whether the reference value is greater than the counter content of counting ramps of each of the at least two counters.

The two counters may count with a same counting period, offset with respect to each other by one half of the counting period.

With respect to top and bottom reversal points of the counting ramps counting according to a delta characteristic, the counter that arrives last at a reversal point, may leave the reversal point first.

A value range of the reference value may be smaller than a value range of the at least two counters.

For each of two power transistors of the half-bridge, a separate reference value may be utilized for the comparison to the counter contents of the counting ramps so that PWM-signals derived adhere to a dead time.

The separate reference values provided for each of the two power transistors of the half-bridge may be symmetrically arranged about the reference value which is proportional to a required voltage at an output of the half-bridge.

Further features and aspects of example embodiments of the present invention are described in more detail below with reference to the appended Figures

DETAILED DESCRIPTION

Figure 1:
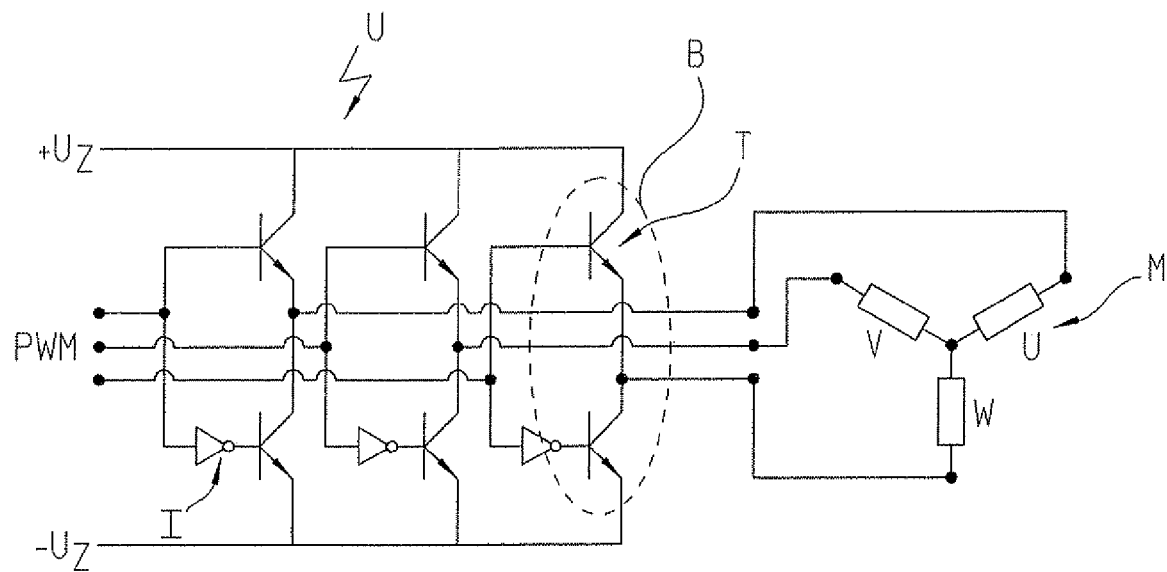
FIG. 1 shows a conventional converter.
Figure 2:
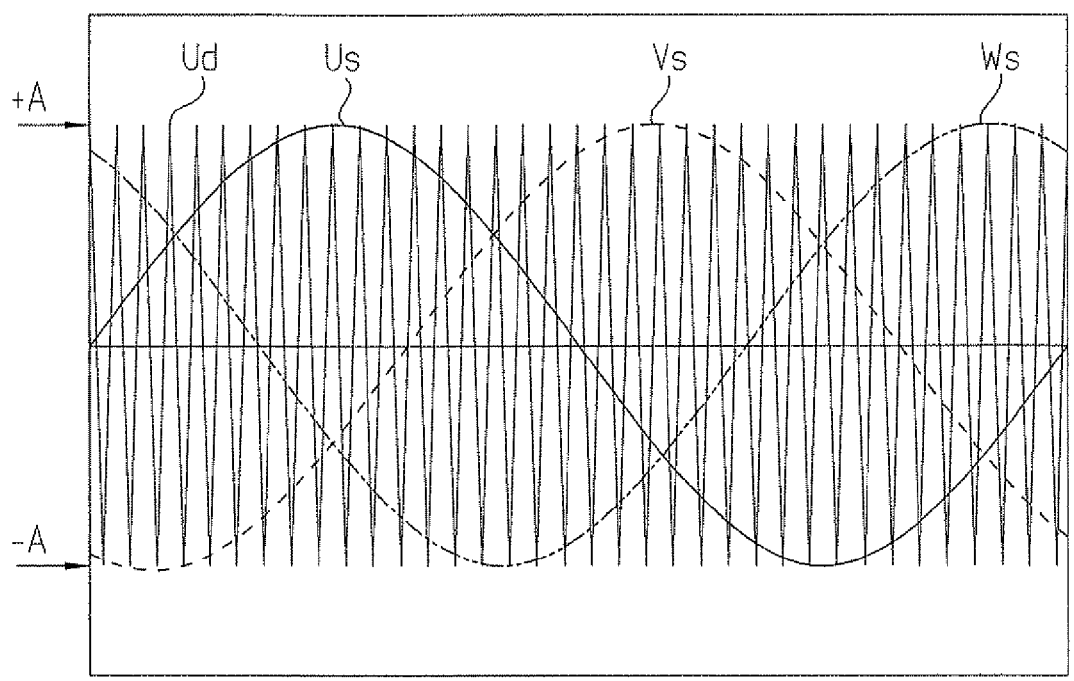
FIG. 2 shows a delta voltage and control voltages in accordance with a conventional PWM method.

FIGS. 1 and 2 were already described above. They clarify the generation and use of PWM-signals PWM for a converter U based on the comparison of an analog delta signal Ud and analog control signals Us.

Figure 3:
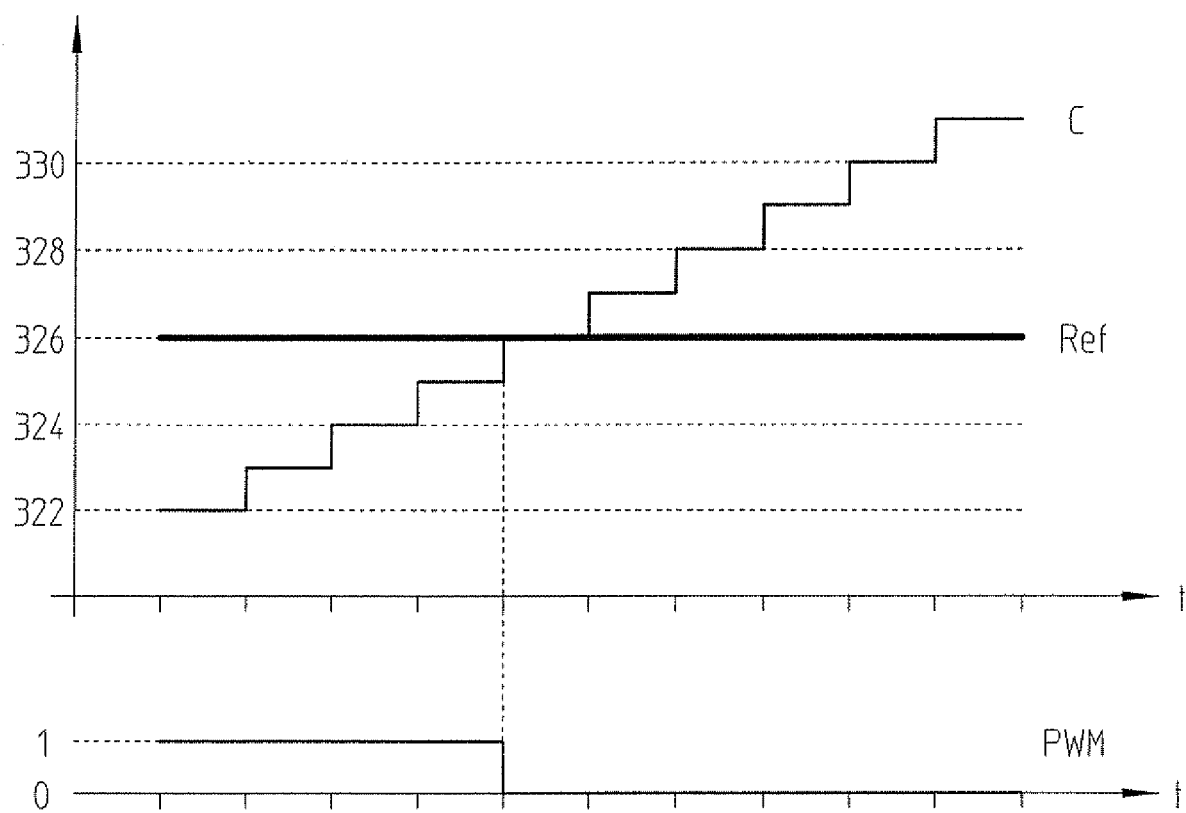
FIG. 3 shows a delta voltage and a control voltage with a conventional digital PWM method.

FIG. 3 clarifies how a PWM-signal PWM is able to be generated using a digital circuit. Analog delta signal Ud of FIG. 2 is replaced by a digital counting ramp C, and analog control voltages Us, Vs, Ws are replaced by a reference value Ref. For the sake of better clarity, FIG. 3 only shows reference value Ref for one phase. In this example, the logic state of PWM-signal PWM for driving power transistors T is dependent upon whether reference value Ref is greater than the counter content of counting ramp C. As long as this condition is satisfied, the PWM-signal is at a high level, otherwise the PWM-signal is at a low level. The PWM-signal is therefore suited for the direct driving of the upper of the two power transistors T of a half-bridge B of converter U illustrated in FIG. 1. In order to drive bottom power transistor T, PWM-signal PWM must still be inverted. In addition, measures must be taken to adhere to the dead time when switching between the two transistors.

For example, for an application demanding very precise driving of electric motor M, a PWM-frequency (corresponding to the frequency of delta signal Ud of FIG. 2) of 144 kHz may be required. If, in this context, reference value Ref is to be predefined with a high resolution of 10 bit, then counting ramp C must also count with this resolution. Therefore, within one period of the PWM-frequency, counting ramp C must count one time from 0 to 1023 and back again from 1023 to 0, in order to obtain a delta characteristic corresponding to the analog signal. It follows from this that the counter must count with a frequency of 1024*2*144 kHz equal to 295 MHz. This is a value which, at present, can only be achieved with very complicated and expensive digital circuits.

To permit use of an inexpensive digital component such as, for example, a FPGA, it is therefore provided to work with two counters, which then only have to count with half the frequency in order to generate PWM-signals of the quality desired. In principle, the use of more than two counters is readily possible as well, only the expenditure for synchronizing and evaluating the counters then increasing. In the example given, counting frequencies which are able to be realized with inexpensively available components are already attained using two counters.

Figure 4:
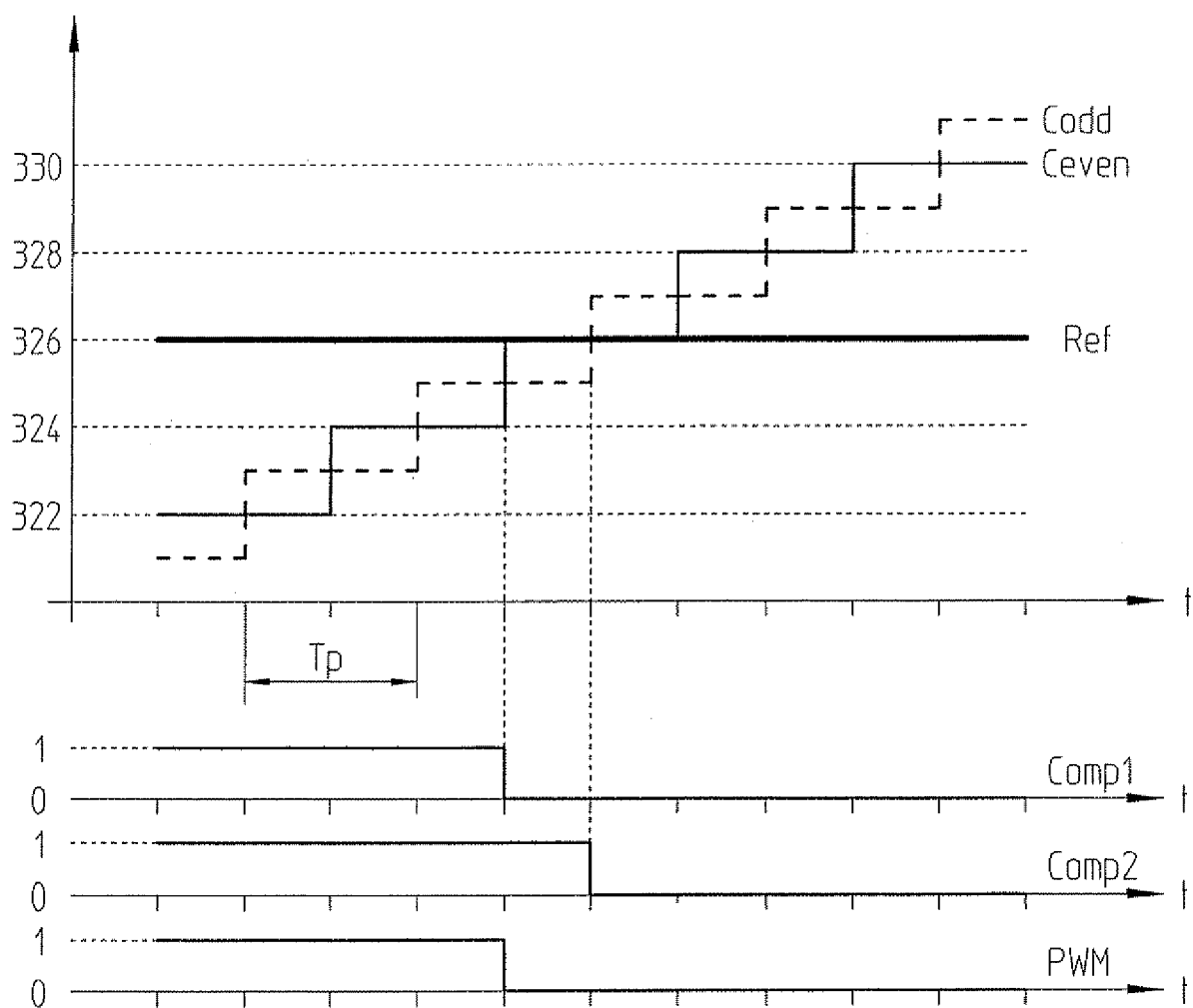
FIG. 4 shows a delta voltage and a control voltage according to an exemplary embodiment of the present invention.

FIG. 4 shows that, using two counting ramps Codd, Ceven, each of which counts only the even or the odd numbers with a counting frequency that is halved in comparison to FIG. 3, i.e., a doubled counting period Tp, a PWM-signal PWM may be generated which corresponds completely to that of FIG. 3. To that end, reference value Ref must be compared to the counter contents of each of the two counting ramps Codd, Ceven. Comparison signals Comp1, Comp2 indicate in each case whether reference value Ref is greater than the counter content of respective counting ramp Codd, Ceven. If the two comparison signals Comp1, Comp2 are combined with a logic AND, a PWM-signal PWM is obtained that behaves like the PWM-signal PWM of FIG. 3.

The two counting ramps Codd, Ceven must satisfy certain conditions in order to attain an optimal result. Thus, they must be shifted by one half counting period Tp relative to one another. This may be realized easily using PLL (Phase Locked Loop) circuits. Such PLL circuits are already integrated in many FPGAs for generating additional clock signals. The phase position of such a PLL circuit may easily be parameterized and is very precisely controlled.

In addition, care must be taken that, at the upper and lower reversal point of counting ramps Codd, Ceven, that counter which arrives last at its reversal point leaves it again as the first.

Due to this second condition, for reference values Ref at or in the immediate vicinity of the two reversal points of counting ramps Codd, Ceven, a behavior of PWM-signal PWM would result that does not completely agree with that which results with only one fast counter. However, this is unimportant, since in practice, reference values Ref do not arrive in the vicinity of the reversal points. The turn-on times and turn-off times obtained in this context are so short that the power transistors really would not be able to implement such PWM-signals. In the numerical example mentioned above, given a reference value Ref of "1," the ON duration of the top power transistor would be at only approximately 7 ns. However, such values are already not possible because of the dead time to be observed which, depending on the amplifier used, is between 100 ns and 2 μs. Therefore, for example, given a value range of the counting ramps of 0 to 1023, reference values Ref between 50 and 973 are used. Thus, the value range of counting ramps Codd, Ceven is not completely utilized for reference value Ref. A safety distance of several percent of the value range remains to the limits of the value range.

In order to take the dead time mentioned into account using conventional arrangements, a logic circuit is needed which is operated with at least the clock pulse of the effective counting ramp used. However, such a high-frequency clock pulse is not available in the preceding exemplary embodiment, since the counting ramp is provided by using two slower phase-shifted counters. The following exemplary embodiment addresses this issue by ensuring the observance of the dead time using only combinatory logic without employing an additional high-frequency clock pulse.

An exemplary embodiment is described with reference to FIG. 5. As in the above-described exemplary embodiment, two counting ramps Codd, Ceven are used. However, two reference values Ref_bot and Ref_top differing from one another are used for the bottom and top power transistors T, respectively, of a half-bridge B of converter U illustrated in FIG. 1. As illustrated, a dead time Td may thus be observed in an easy manner when switching between power transistors T.

Figure 5:
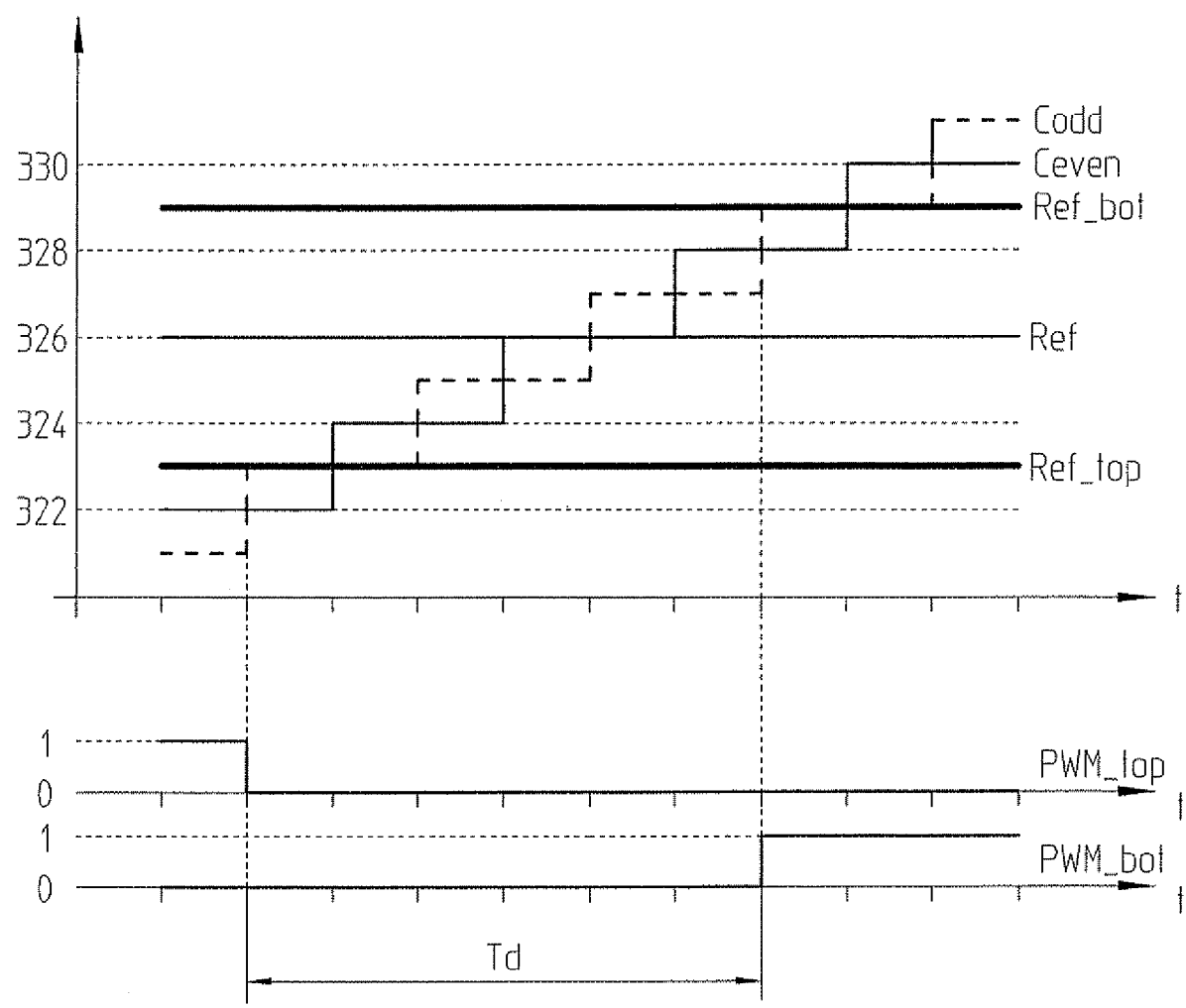
FIG. 5 shows a delta voltage and two control voltages according to an exemplary embodiment of the present invention.

FIG. 5 illustrates that the switchover instant of PWM-signal PWM_top for top power transistor T is earlier than the switchover instant of PWM-signal PWM_bot for the bottom power transistor. PWM-signal PWM_top is obtained with the same logic as PWM-signal PWM of FIG. 4. It is at a high level when reference value Ref_top is greater than the counter content of each of the two counting ramps Codd, Ceven. Correspondingly, for PWM-signal PWM_bot, reference value Ref_bot is compared to the counter contents of counting ramps Codd, Ceven, and the result of this comparison is additionally inverted. It can thus be seen that both power transistors T are switched off for a dead time Td. A short circuit of the intermediate circuit voltage of converter U is thus ruled out by power transistors T responding in delayed fashion.

Figure 6:
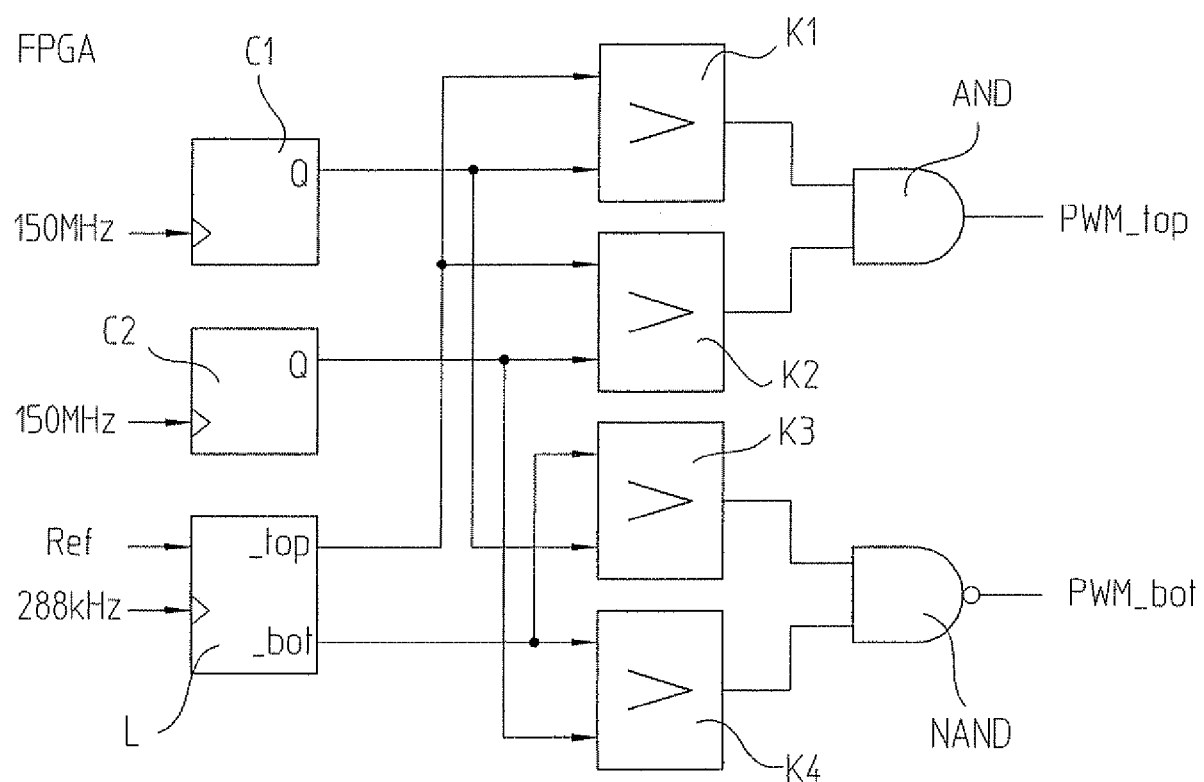
FIG. 6 shows a logic circuit according to an example embodiment of the present invention.

FIG. 6 is a block diagram of the logic circuit with which the exemplary embodiment described with reference to FIG. 5 may be realized.

Two counters C1 and C2 are clocked with 150 MHz. Counter C1 counts counting ramp Codd, and counter C2 counts counting ramp Ceven of FIG. 5. Both counters are shifted by one half counting period relative to one another.

A logic module L receives a reference value Ref, and from it, generates the two reference values Ref_bot and Ref_top illustrated in FIG. 5. The average value of the two reference values Ref_bot and Ref_top corresponds exactly to original reference value Ref, which is proportional to a required voltage at an output of half-bridge B. In this manner, dead time Td is distributed symmetrically about the original switching instant.

A comparator K1 checks whether reference value Ref_top is greater than the counter content of C1. A comparator K2 checks whether reference value Ref_top is greater than the counter content of C2. The outputs of the two comparators K1, K2, combined with a logic AND, yield PWM-signal PWM_top for driving top power transistor T of a half-bridge.

A comparator K3 checks whether reference value Ref_bot is greater than the counter content of C1. A comparator K4 checks whether reference value Ref_bot is greater than the counter content of C2. The outputs of the two comparators K3, K4, combined with a logic NOT-AND (NAND), yield PWM-signal PWM_bot for driving bottom power transistor T of a half-bridge.

Both exemplary embodiments described herein permit the generation of PWM-signals for driving the power transistors in a converter, a reference value with 10 bit resolution being compared to a counter likewise with 10 bit resolution at a counting frequency of 295 MHz. This succeeds, although internally only a clock pulse of approximately 150 MHz is available. According to the second-described example embodiment, the PWM-signals for the top and bottom power transistors of a half-bridge in a converter are generated such that the dead time is observed when switching between the two power semiconductors, without still further measures being necessary for that purpose.

When, in the exemplary embodiments described herein, the condition "reference value is greater than the counter content" is used, then by that, either the condition "is greater," or alternatively, the condition "is greater than or equal to" is meant. In this regard, in the case of the equality of reference value and counter content, whether the corresponding PWM-signal is at a high level or at a low level is unimportant, and may be determined as desired.

What is claimed is:

1. A method for generating a PWM-signal to drive power transistors of a half-bridge of a converter with the aid of a digital circuit, comprising:
   counting, by at least two counters, counter contents of a corresponding counting ramp following one another in alternation;
   comparing a digital reference value to the counter content of a counting ramp; and
   generating the PWM-signal, a logic state of the PWM-signal being dependent upon whether the reference value is greater than the counter content of counting ramps of each of the at least two counters.

2. The method according to claim 1, wherein the at least two counters count with a same counting period, offset with respect to each other by one half of the counting period.

3. The method according to claim 1, wherein, with respect to top and bottom reversal points of the counting ramps counting according to a delta characteristic, the counter that arrives last at a reversal point, leaves the reversal point first.

4. The method according to claim 1, wherein a value range of the reference value is smaller than a value range of the at least two counters.

5. The method according to claim 1, wherein for each of two power transistors of the half-bridge, a separate reference value is utilized for the comparison to the counter contents of the counting ramps so that PWM-signals derived adhere to a dead time.

6. The method according to claim 5, wherein the separate reference values provided for each of the two power transistors of the half-bridge are symmetrically arranged about the reference value which is proportional to a required voltage at an output of the half-bridge.

* * * * *